US011024657B2

(12) United States Patent
Li et al.

(10) Patent No.: US 11,024,657 B2
(45) Date of Patent: Jun. 1, 2021

(54) TRANSISTOR, ARRAY SUBSTRATE AND METHOD OF MANUFACTURING THE SAME, DISPLAY DEVICE

(71) Applicant: BOE TECHNOLOGY GROUP CO., LTD., Beijing (CN)

(72) Inventors: Zhengliang Li, Beijing (CN); Ce Ning, Beijing (CN); Song Liu, Beijing (CN); Wenlin Zhang, Beijing (CN); Xuefei Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 231 days.

(21) Appl. No.: 16/318,740

(22) PCT Filed: Apr. 2, 2018

(86) PCT No.: PCT/CN2018/081572
§ 371 (c)(1),
(2) Date: Jan. 18, 2019

(87) PCT Pub. No.: WO2019/033762
PCT Pub. Date: Feb. 21, 2019

(65) Prior Publication Data
US 2020/0286929 A1 Sep. 10, 2020

(30) Foreign Application Priority Data
Aug. 18, 2017 (CN) .......................... 201710710353.4

(51) Int. Cl.
*H01L 27/12* (2006.01)

(52) U.S. Cl.
CPC ...... *H01L 27/1248* (2013.01); *H01L 27/1259* (2013.01)

(58) Field of Classification Search
None
See application file for complete search history.

(56) References Cited

U.S. PATENT DOCUMENTS

2013/0264564 A1   10/2013   Park et al.

FOREIGN PATENT DOCUMENTS

| CN | 102270644 A | 12/2011 |
| CN | 102683422 A | 9/2012 |
| CN | 102703879 A | 10/2012 |
| CN | 103887343 A | 6/2014 |
| CN | 104538405 A | 4/2015 |
| CN | 105097940 A | 11/2015 |
| CN | 107516647 A | 12/2017 |

OTHER PUBLICATIONS

English translation of CN104538405, total pp. 8. (Year: 2015).*

(Continued)

*Primary Examiner* — Bo B Jang
(74) *Attorney, Agent, or Firm* — The Webb Law Firm

(57) ABSTRACT

The present disclosure provides a transistor, an array substrate and a method of manufacturing the array substrate, and a display device. The method of manufacturing the array substrate comprises: depositing a plurality of silicon oxide layers on an active layer of a transistor; and depositing a silicon oxynitride layer over the plurality of silicon oxide layers.

19 Claims, 4 Drawing Sheets

(56) References Cited

OTHER PUBLICATIONS

First Office Action for CN Appl. No. 201110110353.4, dated Aug. 23, 2019.
Second Office Action for CN Appl. No. 201710710353.4, dated Apr. 17, 2020.
International Search Report and Written Opinion for International Appl. No. PCT/CN2018/081572, dated Jun. 28, 2018.

* cited by examiner

TRANSISTOR, ARRAY SUBSTRATE AND METHOD OF MANUFACTURING THE SAME, DISPLAY DEVICE

CROSS REFERENCE TO RELATED APPLICATIONS

This application is a national stage of International Application No. PCT/CN2018/081572, filed on Apr. 2, 2018, which claims priority to Chinese Patent Application No. 201710710353.4, filed on Aug. 18, 2017. Both of the aforementioned applications are hereby incorporated by reference in their entireties.

FIELD OF THE INVENTION

The present disclosure relates to the field of display technology, and in particular, to a transistor, an array substrate and a method of manufacturing the same, and a display device.

BACKGROUND

At present, with the development of technology, the metal oxide thin film transistor (TFT) using metal oxide as the material for the active layer has emerged. The metal oxide TFT has the advantage of high carrier mobility, so that TFTs can be formed in very small size, resulting in high resolution of flat panel displays and good display effect. At the same time, the metal oxide TFT also has the advantages of low leakage current, low material and process costs, low process temperature, applicable to coating process, high transparency, large band gap and so on, thus it has attracted much attention in the industry.

DISCLOSURE OF THE INVENTION

The present disclosure is intended to provide a transistor, an array substrate and a method of manufacturing the array substrate, and a display device.

According to a first aspect of the present disclosure, a method of manufacturing an array substrate is provided, including: depositing a plurality of silicon oxide layers on an active layer of a transistor; and depositing a silicon oxynitride layer on the plurality of silicon oxide layers.

According to a second aspect of the present disclosure, a transistor is provided, including: an active layer; a plurality of silicon oxide layers on the active layer; and a silicon oxynitride layer on the plurality of silicon oxide layers.

According to a third aspect of the present disclosure, an array substrate is provided, including a transistor array, wherein at least a portion of the transistors in the transistor array include: an active layer; a plurality of silicon oxide layers on the active layer; and a silicon oxynitride layer on the plurality of silicon oxide layers.

In accordance with a fourth aspect of the present disclosure, a display device is provided, including the array substrate according to the third aspect of the present disclosure.

DETAILED DESCRIPTION OF PREFERRED EMBODIMENTS

Figure 1:
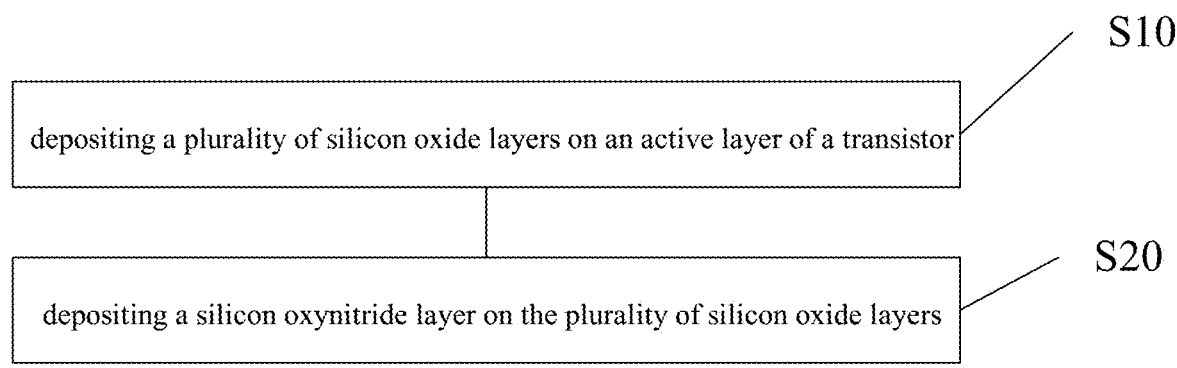
FIG. 1 is a flow chart of a method of manufacturing an array substrate provided in the present disclosure.

The present disclosure will be further described with reference to the accompanying drawings and exemplary embodiments, in which the same reference signs in the drawings refer to the same parts. In addition, if a detailed description of a known technique is not necessary to illustrate the features of the present disclosure, it will be omitted.

In the existing metal oxide TFT, the passivation layer is made of one of a silicon oxide film, a silicon nitride film or a silicon oxynitride film. Some hydrogen ions in the passivation layer may diffuse into the oxide semiconductor layer, resulting in more hydrogen in the oxide semiconductor layer, and excessive hydrogen may cause the oxide semiconductor layer to be conductorized, thus short-circuit is prone to occur in the TFT device, seriously affecting the performance of TFT products.

Figure 4:
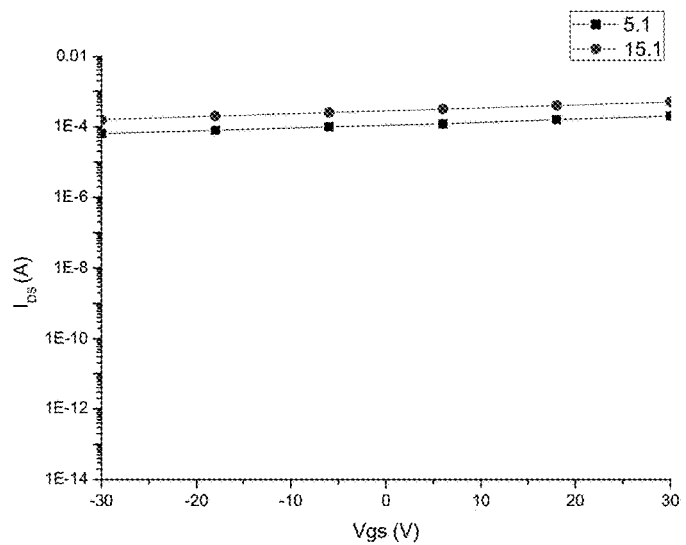
FIG. 4 is a characteristic curve of a TFT manufactured using a conventional method.

For example, FIG. 4 is a characteristic curve of a TFT manufactured using a conventional method. As shown in FIG. 4, in the case where the voltage Vds between the source and drain electrodes are 5.1v and 15.1v, respectively, the trend of the threshold voltage Vth changing with Vds is that: Vth moves toward the direction where the negative voltage value increases with the increase of Vds. In addition, from the change of current Ins between the source and drain electrodes in FIG. 4, it can also be seen that the TFT has a tendency to be conductorized.

Figure 2:
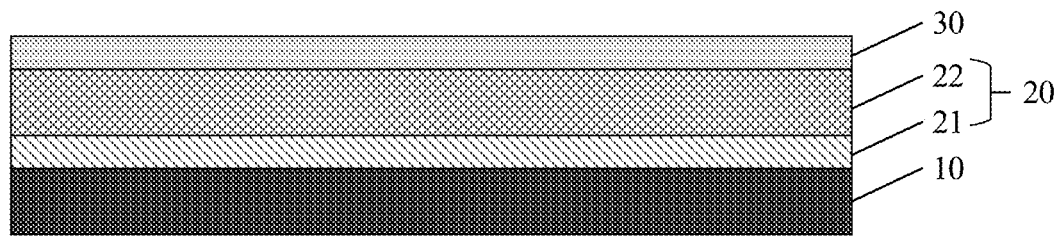
FIG. 2 is a schematic diagram of a partial structure of the array substrate provided in the present disclosure, which mainly shows a layered structure of the silicon oxide layer.

FIG. 2 schematically illustrates a portion of the structure of a transistor in the array substrate according to an embodiment of the present disclosure. As shown in FIG. 2, a silicon oxide layer 20 is formed on the active layer 10, and a silicon oxynitride layer 30 is formed on the silicon oxide layer 20. The silicon oxide layer 20 includes a first silicon oxide layer 21 and a second silicon oxide layer 22. An example of a method of manufacturing the array substrate will be described in detail below with reference to FIG. 1.

As shown in FIG. 1, according to an embodiment of the present disclosure, there is provided a method of manufacturing an array substrate, including following steps:

S10, depositing a silicon oxide layer 20 having a multi-layered structure on the active layer 10 of the transistor;

S20, depositing a silicon oxynitride layer 30 on the silicon oxide layer 20.

The silicon oxide layer 20 may include two or more silicon oxide layers. According to one embodiment of the present disclosure, the silicon oxide layer 20 may have two silicon oxide layers. An array substrate structure including two structural silicon oxide layers is shown in FIG. 2. The silicon oxide layer 20 may include a first silicon oxide layer 21 and a second silicon oxide layer 22. According to an embodiment of the present disclosure, the step of depositing a silicon oxide layer 20 having a multi-layered structure on the active layer may include:

depositing a first silicon oxide layer 21 on the active layer 10. For example, the first silicon oxide layer 21 may be formed using nitrogen monoxide and silane by a plasma enhanced chemical vapor deposition (PECVD) method. Wherein, the silane may be, for example, monosilane, disilane, trisilane, etc. In an exemplary example, nitrogen monoxide and monosilane are introduced into the reaction chamber of a PECVD apparatus, and the mass flow ratio of nitrogen monoxide is controlled in the range of 35:1 to 45:1.

Then, a second silicon oxide layer 22 is deposited on the first silicon oxide layer 21. Similar to the manner in which the first silicon oxide layer 21 is formed in the above step, the second silicon oxide layer 22 may also be deposited by PECVD.

In some embodiments according to the present disclosure, the hydrogen content in the first silicon oxide layer 21 is higher than the hydrogen content in the second silicon oxide layer 22. In other embodiments according to the present disclosure, the oxygen content in the first silicon oxide layer 21 is lower than the oxygen content in the second silicon oxide layer 22.

In some examples, the hydrogen content and/or oxygen content may be adjusted by, for example, controlling the deposition conditions of the first silicon oxide layer 21 and the second silicon oxide layer 22. For example, during the deposition of the second silicon oxide layer 22 by PECVD, the mass flow ratio of nitrogen monoxide to monosilane is controlled in the range of 75:1 to 85:1. In this way, it can be ensured that the hydrogen content in the second silicon oxide layer 22 is lower than the hydrogen content in the first silicon oxide layer 21, and the oxygen content in the second silicon oxide layer 22 is higher than the oxygen content in the first silicon oxide layer 21.

In some embodiments according to the present disclosure, when the silicon oxide layer 20 is composed of two or more silicon oxide layers, the hydrogen content in the first silicon oxide layer of the plurality of silicon oxide layers which is adjacent to the active layer is higher than that in other silicon oxide layers. In this way, even if hydrogen diffusion occurs in the first silicon oxide layer, it will diffuse to other silicon oxide layers containing less hydrogen, thus preventing hydrogen in the first silicon oxide layer from diffusing to the active layer and avoiding the transistor from being conductorized. In addition, when the oxygen content in the first silicon oxide layer is lower than that in the other silicon oxide layers, the higher oxygen content in the other silicon oxide layers enables the formation of a dense silicon oxide film, thereby protecting the device from external contamination.

In some embodiments according to the present disclosure, the thickness of the first silicon oxide layer 21 adjacent to the active layer ranges from 200 Å to 800 Å, for example, the thickness of the first silicon oxide layer may be 500 Å. The thickness of the first silicon oxide layer is greater than 200 Å to form an oxide protective film to protect the active layer from contamination by other layers and the outside environment. The thickness of the first silicon oxide layer is less than 800 Å to prevent hydrogen in the passivation layer from diffusing into the active layer, resulting in the device being conductorized.

In some embodiments according to the present disclosure, the thickness of the second silicon oxide layer 22 may range from 500 Å to 1000 Å, for example, the thickness of the second silicon oxide layer may be 800 Å. The thickness of the second silicon oxide layer may be greater than 500 Å to block the diffusion of hydrogen and thus prevent the device from being conductorized. The thickness of the second silicon oxide layer is less than 1000 Å so as to avoid introducing excessive oxygen to affect device performance.

In another embodiment according to the present disclosure, the silicon oxide layer may be a structure having more than two layers. For example, a third silicon oxide layer (not shown) may be formed between the first silicon oxide layer 21 and the second silicon oxide layer 22 as shown in FIG. 2. Wherein, the first silicon oxide layer, the third silicon oxide layer, and the second silicon oxide layer may be sequentially formed on the active layer 10. The third silicon oxide layer may also be prepared by, for example, PECVD. For example, a third silicon oxide layer may be deposited using nitrogen monoxide and monosilane gases with a mass flow ratio of 45:1 to 75:1.

In some embodiments according to the present disclosure, the first silicon oxide layer is made from nitrogen monoxide and monosilane with a mass flow ratio of 40:1, and the second silicon oxide layer is made from nitrogen monoxide and monosilane with a mass flow ratio of 80:1. The third silicon oxide layer itself may also be a structure having one or more layers of silicon oxide. For example, the third silicon oxide layer may include three silicon oxide layers, each having different deposition conditions. For example, during PECVD, the mass flow ratio of nitrogen monoxide to monosilane is gradually increased or decreased. For example, in an exemplary embodiment, the mass flow ratios of nitrogen monoxide to monosilane are 50:1, 60:1 and 70:1, respectively, thereby forming three silicon oxide layers of the third silicon oxide layer.

Comparing with the first silicon oxide layer, the third silicon oxide layer deposited under the above condition has lower hydrogen content and higher oxygen content, its function is similar to the second silicon oxide layer, both of them may prevent hydrogen in the first silicon oxide layer from diffusing to the active layer and further preventing the device from being conductorized.

Finally, a silicon oxynitride layer 30 may be formed on the silicon oxide layer.

Specifically, the silicon oxynitride layer may be formed by doping nitrogen or nitriding a previously formed silicon oxide layer. Heat treatment nitriding, chemical deposition or physical deposition can be adopted for the nitriding process. For example, in an embodiment according to the present disclosure, a silicon oxide layer is first prepared by plasma enhanced chemical vapor deposition, the deposition temperature may be, for example, 200-350° C., the reaction gas may be, for example, nitrogen monoxide and silane, and the mass flow ratio of nitrogen monoxide to silane gases may be 60:1 to 100:1, for example, for example, the mass flow ratio of nitrogen monoxide to silane may be 70:1. The deposition process and the ratio of reaction gases are used to obtain a dense silicon dioxide film for blocking the diffusion of hydrogen in the silicon oxynitride layer, and the dense silicon dioxide film obtained by this method can block the diffusion of hydrogen in the silicon oxynitride layer even if the annealing temperature is higher than 250° C. Then, the obtained silicon dioxide film is nitrided, for example, by heat treatment nitriding, and the gas for the nitriding is one or more of $N_2O$, NO or $NH_3$. In addition, chemical deposition or physical deposition can also be adopted, such as low-energy ion implantation, jet vapor deposition, atomic layer deposition, plasma nitridation, etc.

According to some embodiments of the present disclosure, the silicon oxynitride layer may also be annealed at a temperature not higher than 250° C. to reduce hydrogen diffusion in the silicon oxynitride layer.

It should be noted that the silicon oxide layer and the silicon oxynitride layer described in this disclosure constitute a passivation layer of the array substrate.

In the prior art, the passivation layer is one of a silicon nitride (SiNx) layer, a silicon oxynitride (SiON) layer, and a silicon oxide (SiOx) layer. The passivation layer provided by the present disclosure adopts a composite structure of a silicon oxide layer and a silicon oxynitride layer, the silicon oxide layer has a multi-layered structure, and different layers are made under different process conditions, so that this layer can prevent hydrogen from diffusing from the passivation layer to the oxide semiconductor layer while forming an oxide protective film.

The passivation layer adopts a composite structure, which can form an oxide film on the surface of the active layer to isolate the device from the external environment, at the same time the process conditions for forming multiple layers of silicon oxide can effectively prevent hydrogen in the passivation layer from diffusing to the active layer.

Compared with the existing method of specifically forming a hydrogen barrier layer using any one of materials including indium tin oxide (ITO), indium zinc oxide (IZO), molybdenum (Mo), molybdenum titanium alloy (MoTi), copper (Cu), silver (Ag), gold (Au), Ti, zirconium (Zr), thorium (Th), vanadium (V), palladium (Pd), nickel (Ni) and tin (Sn), the present disclosure can achieve the purpose of preventing hydrogen diffusion from the passivation layer to the oxide semiconductor only by changing the structure and deposition condition of the passivation layer, which is simple and easy to implement, without the need of additionally adding a barrier layer containing those rare elements, so that the production cost can be reduced.

Figure 8:
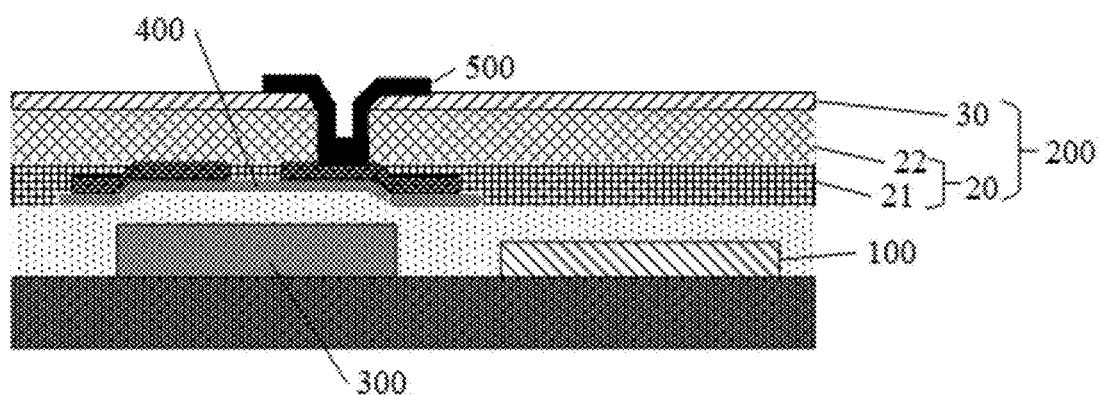
FIG. 8 is a schematic diagram of an array substrate structure provided in the present disclosure.

FIG. 8 shows a schematic diagram of an array substrate according to an embodiment of the present disclosure. As shown in FIG. 8, the array substrate may include a gate electrode 300, an active layer 400, a passivation layer 200, a common electrode 100, and a pixel electrode 500, and the passivation layer includes a silicon oxide layer 20 and a silicon oxynitride layer 30 sequentially stacked on a side of the active layer away from the common electrode, wherein the silicon oxide layer 20 has a multi-layered structure. For the sake of clarity, only one transistor is shown in the array substrate in FIG. 8. Those skilled in the art will understand that there is usually an array formed by a plurality of transistors on the array substrate.

According to an embodiment of the present disclosure, the active layer may be a metal oxide semiconductor, such as one of indium gallium zinc oxide (IGZO), zinc indium oxide (ZIO), zinc gallium oxide (ZGO) and zinc tin oxide (ZTO). In one example, the active layer is IGZO.

The structure of current oxide thin film transistors (TFT) mainly includes: Etch Stop type (ESL), Back Channel Etch type (BCE) and Coplanar type. In the BCE structure, a side of the semiconductor active layer close to the insulating layer is affected by the etching liquid or etching gas during the source and drain etching process, thus affecting the characteristics of the semiconductor active layer. The ESL structure needs an additional photolithography process than the BCE structure, so the equipment investment cost is higher and the production cycle is longer.

Therefore, the array substrate according to an embodiment of the present disclosure shown in FIG. 8 adopts BCE type thin film transistors. The array substrate provided by the present disclosure is a 4-mask or 5-mask device. The array substrate shown in FIG. 8 is made by using five masks (5-mask), and the steps of making the 5-mask array substrate are as follows:

step 1, depositing a conductive layer on a substrate and forming a conductive common electrode by a patterning process;

step 2, depositing a gate metal film on the substrate after step 1 is completed, and forming a pattern including the gate electrode by a patterning process;

step 3, forming a pattern of an active layer on the substrate after the step 2 is completed by a patterning process;

step 4, forming a passivation layer on the substrate after step 3 is completed;

step 5, depositing a conductive layer on the substrate after step 4 is completed, and forming a conductive pixel electrode by a patterning process.

A TFT for which the common electrode in step 1 and the gate electrode in step 2 are formed using the same mask is a 4-mask device.

The silicon oxide layer includes two or more layers.

In some embodiments of the present disclosure, the silicon oxide layer has a two-layer structure, and the silicon oxide layer includes: a first silicon oxide layer close to the active layer and a second silicon oxide disposed on a side of the first silicon oxide layer away from the active layer. The first silicon oxide layer may be made from nitrogen monoxide and silane with a mass flow ratio ranging from 35:1 to 45:1. In an example, the nitrogen monoxide and silane have a mass flow ratio of 40:1. The first silicon oxide layer prepared at this reaction gas ratio is close to the active layer, which can prevent hydrogen in this layer from diffusing into the active layer, and the formed silicon oxide film can achieve the purpose of protecting the transistor.

The second silicon oxide layer is made from nitrogen monoxide and silane with a mass flow ratio ranging from 75:1 to 85:1. In an example, the nitrogen monoxide and silane have a mass flow ratio of 80:1. Compared with the first silicon oxide layer, the hydrogen content of the second silicon oxide layer is reduced and the oxygen content is increased, so that hydrogen in the second silicon oxide layer is difficult to diffuse to the first silicon oxide layer. Even if hydrogen diffusion occurs in the first silicon oxide layer, hydrogen will diffuse to the second silicon oxide layer containing less hydrogen, further preventing hydrogen in the first silicon oxide layer from diffusing to the active layer. The increased oxygen content enables a dense silicon oxide film to be formed in this layer to protect the device from external contamination.

The thickness of the first silicon oxide layer is in the range of 200 Å-800 Å. For example, the thickness of the first silicon oxide layer may be 500 Å. The thickness of the first silicon oxide layer is usually greater than 200 Å to form an oxide protective film for protecting the active layer from contamination by other layers and the outside environment. The thickness of the first silicon oxide layer is usually less than 800 Å to prevent hydrogen in the passivation layer from diffusing to the active layer, which otherwise may cause the device to be conductorized.

The thickness of the second silicon oxide layer ranges from 500 Å to 1000 Å. For example, the thickness of the second silicon oxide layer may be 800 Å. The thickness of the second silicon oxide layer is usually greater than 500 Å to prevent the diffusion of hydrogen in the passivation layer and thus prevent the device from becoming conductorized.

The thickness of the second silicon oxide layer is generally less than 1000 Å to avoid introducing too much oxygen to affect device performance.

In another embodiment of the present disclosure, the silicon oxide layer includes more than two layers, and the silicon oxide layer includes a first silicon oxide layer adjacent to the active layer, a third silicon oxide layer and a second silicon oxide layer sequentially stacked on a side of the first silicon oxide layer away from the active layer. The first silicon oxide layer is made from nitrogen monoxide and silane with a mass flow ratio between 35:1 and 45:1; the third silicon oxide layer is made from nitrogen monoxide and silane with a mass flow ratio between 45:1 and 75:1, wherein the third silicon oxide layer is a layered structure having at least one layer; The second silicon oxide layer is made from nitrogen monoxide and silane with a mass flow ratio between 75:1 and 85:1.

In an embodiment according to the present disclosure, the first silicon oxide layer is made from nitrogen monoxide and silane with a mass flow ratio of 40:1, and the second silicon oxide layer is made from nitrogen monoxide and silane with a mass flow ratio of 40:1. The third silicon oxide layer includes one or more layers of silicon oxide made from nitrogen monoxide and silane with a mass flow ratio of 45:1-75:1, for example, a layer of silicon oxide structure can be formed with an mass flow ratio of nitrogen monoxide to silane gases being 60:1, or a multi-layered silicon oxide structure formed by gradually increasing or decreasing the mass flow ratio, such as the third silicon oxide layer includes three layers which are formed with reaction ratios of nitrogen monoxide and silane being 50:1, 60:1 and 70:1, respectively.

The performance of the device in the embodiment of the present disclosure will be described below in conjunction with the experimental results.

Figure 3:
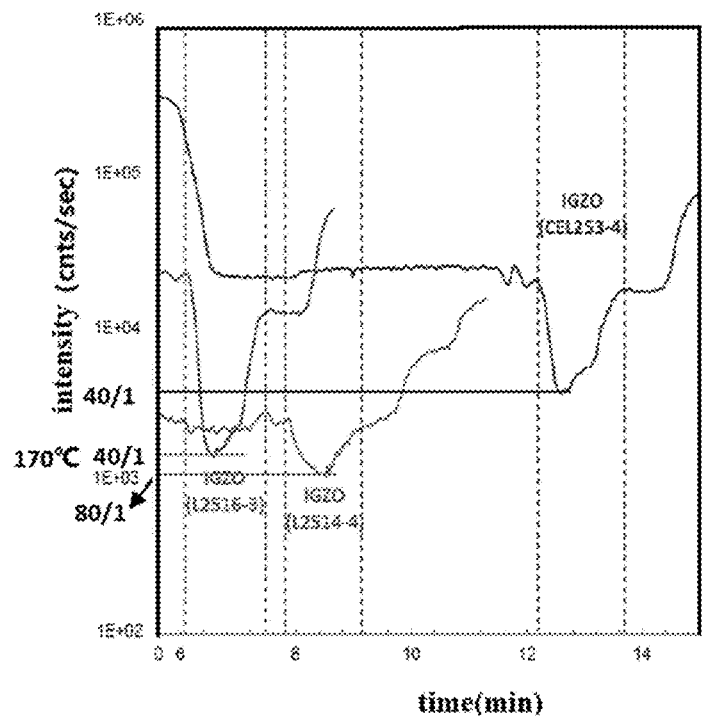
FIG. 3 shows the content of hydrogen in the channel region of the array substrate under different process conditions provided in the present disclosure.

The hydrogen contents in the channel region under different process conditions provided by the embodiments of the present disclosure are shown in FIG. 3, in the case where the mass flow ratio of nitrogen monoxide to silane is 40:1 (annealing temperature 250° C.), the hydrogen content in the channel layer is about half an order of magnitude more than that in the case where the mass flow ratio of nitrogen monoxide to silane is 80:1 (annealing temperature 250° C.). However, when the mass flow ratio of nitrogen monoxide to silane is 40:1 and the annealing temperature of the passivation layer is 170° C., the hydrogen content in the channel layer is greatly reduced. It shows that lowering the annealing temperature can greatly prevent hydrogen in the passivation layer from diffusing to the active layer.

Figure 6:
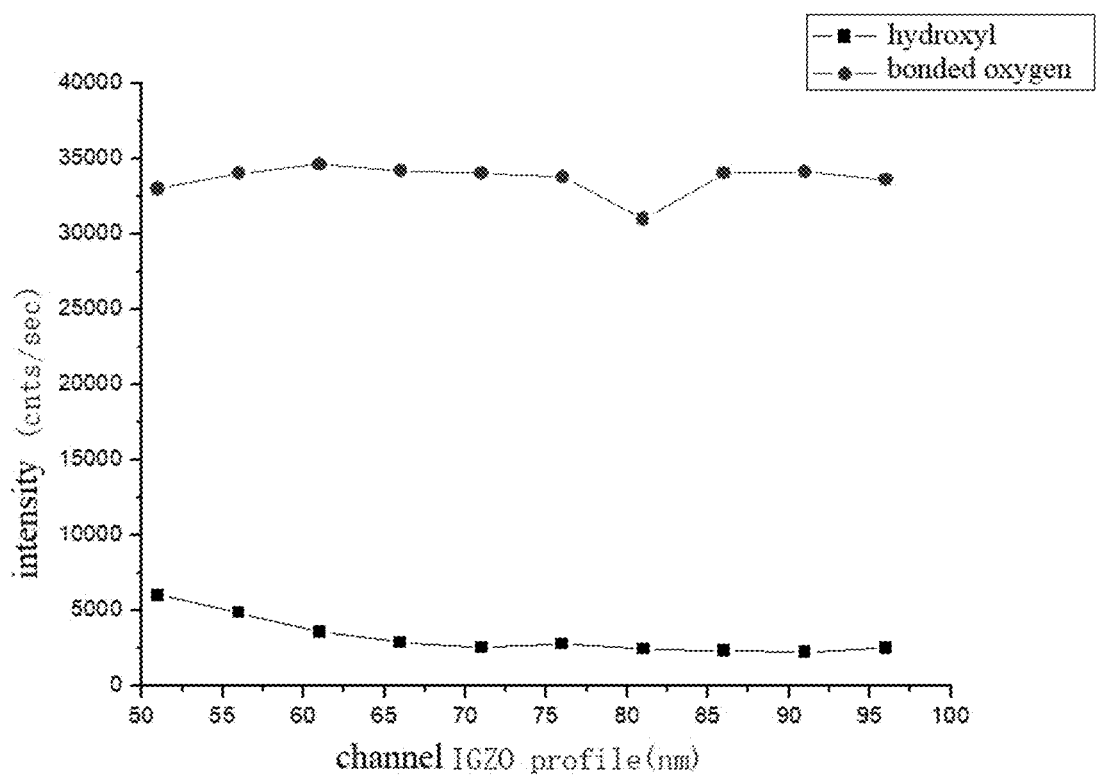
FIG. 6 shows the content and existence state of hydrogen in the channel region of a TFT manufactured using the conventional method.

FIG. 6 shows the content and existence state of hydrogen in the channel region of a TFT device manufactured in a process condition before the present disclosure, i.e., in the prior art. The passivation layer of the TFT device in FIG. 6 contains only one layer of silicon oxide, and the thickness of the silicon oxide layer is 1000 Å, which is obtained by performing deposition with nitrogen monoxide and monosilane gases according to a mass flow ratio of 30:1. As can be seen from FIG. 6, excess hydrogen is mostly combined with oxygen in the channel region, exists in the form of hydroxyl groups, and is uniformly distributed in the channel region.

Figure 7:
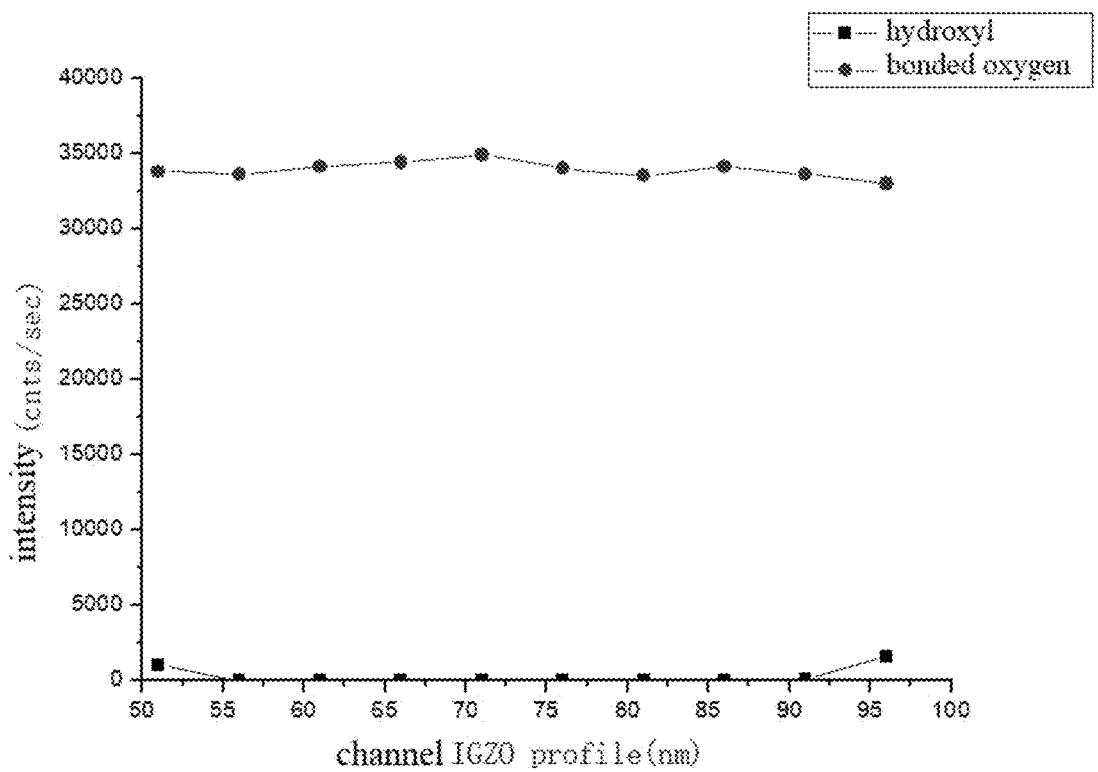
FIG. 7 shows the content and existence state of hydrogen in a TFT channel region manufactured using the manufacturing method provided in the present disclosure.

FIG. 7 shows the content and existence state of hydrogen in the channel region of a TFT device manufactured according to an embodiment of the present disclosure. In this embodiment, the passivation layer includes two silicon oxide layers and one silicon oxynitride layer, wherein the thickness of a first silicon oxide layer adjacent to the active layer is 200 Å, which is obtained by deposition using nitrogen monoxide and monosilane gases according to a mass flow ratio of 40:1, and the thickness of a second silicon oxide layer is 800 Å, which is obtained by deposition using nitrogen monoxide and monosilane gases according to a mass flow ratio of 80:1. As shown in FIG. 7, the content of hydroxyl groups approaches zero, i.e., the channel region of the active layer substantially does not contain hydroxyl groups, indicating that changing the structure and process condition of the passivation layer can effectively prevent hydrogen from diffusing into the active layer.

Figure 5:
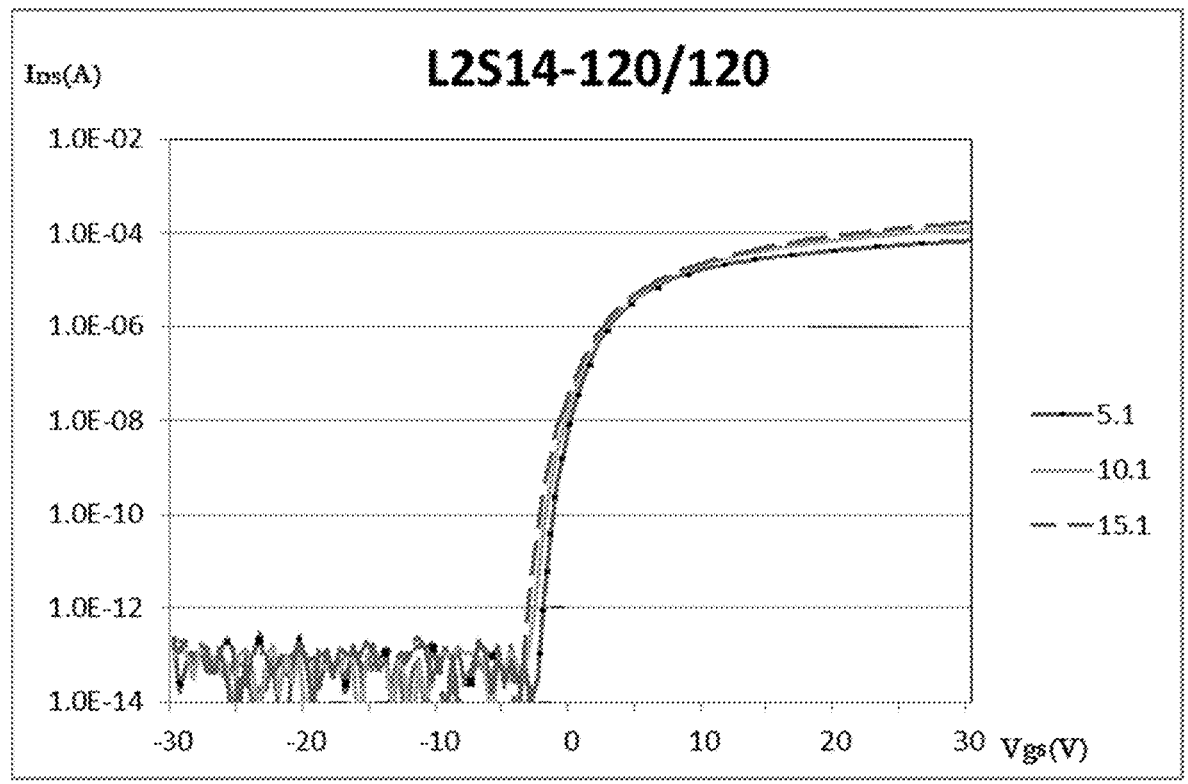
FIG. 5 is a characteristic curve of a TFT manufactured using the manufacturing method provided in the present disclosure.

FIG. 5 is a characteristic diagram of performance test of the exemplary TFT device of FIG. 7. From FIG. 5, it can be seen that the Vth of the oxide thin film transistor changes negatively with Vds. But after Vds changes from 5.1V to 15.1V, the Vth of the oxide thin film transistor basically does not change with Vds, indicating that the process of changing the passivation layer to prevent hydrogen from diffusing to the oxide conductor layer has greatly improved the performance of the oxide thin film transistor.

In addition, the present disclosure further provides a display device including the array substrate described above.

An embodiment of the present disclosure further provides a display device including the above array substrate. The display device can be any product or component with display function such as a display panel, a liquid crystal panel, electronic paper, an OLED panel, a liquid crystal television, a liquid crystal display, a digital photo frame, a mobile phone, a tablet computer, etc.

Since the display device is improved on the basis of the array substrate, the display device naturally inherits all the advantages of the array substrate.

Compared with the prior art, the present disclosure has the following advantages:

the present disclosure provides an array substrate and a method of manufacturing the array substrate, directed to a problem that thin film transistors tend to be short-circuited due to excessive hydrogen elements in the active layer. The existing passivation layer which is a single-layer is replaced with a composite structure of a silicon oxide layer which is a structure having multiple layers and a silicon oxynitride layer, and the multi-layered structure of the silicon oxide layers is manufactured under different process conditions. By adopting a composite structure of a silicon oxide layer and a silicon oxynitride layer for the passivation layer, the effect of the passivation layer protecting the device can be enhanced. The silicon oxide layer with a multi-layered structure is manufactured under different process conditions to prevent diffusion of hydrogen in the passivation layer. The process is simple, and can effectively prevent hydrogen in the passivation layer from diffusing to the active layer and solve the problem of short circuit of the device caused by excessive hydrogen in the active layer.

Further, the first silicon oxide layer is made from nitrogen monoxide and silane with a ratio ranging from 35:1 to 45:1. The first silicon oxide layer prepared with this ratio of reaction gases can prevent hydrogen in this layer from diffusing into the active layer, and the formed silicon oxide film can achieve the purpose of protecting the device. The second silicon oxide layer is made from nitrogen monoxide and silane with a ratio ranging from 75:1-85:1. Compared with the first silicon oxide layer, the hydrogen content of the second silicon oxide layer is reduced and the oxygen content is increased, so that hydrogen in the second silicon oxide layer is difficult to diffuse to the first silicon oxide layer. Even if hydrogen diffusion occurs in the first silicon oxide layer, hydrogen will diffuse to the second silicon oxide layer containing less hydrogen, further preventing hydrogen in the first silicon oxide layer from diffusing to the active layer. The increase in oxygen content enables a dense silicon oxide thin film to be formed in this layer to protect the device from external contamination.

Furthermore, in the array substrate provided by the present disclosure, although different silicon oxide layers have different ratios of the reaction gases and thickness values, the reaction gases of the multi-layered silicon oxide layers are the same, and the same deposition method and device can be used to reduce the process complexity and production cost.

Although some exemplary embodiments of the present disclosure have been shown above, those skilled in the art will understand that changes may be made to these exemplary embodiments without departing from the principles or spirit of the present disclosure, the scope of which is defined by the claims and their equivalents.

What is claimed is:

1. A method of manufacturing an array substrate, comprising:
    depositing a plurality of silicon oxide layers on an active layer of a transistor, including:
        depositing a first silicon oxide layer on the active layer; and
        depositing a second silicon oxide layer above the first silicon oxide layer by using nitrogen monoxide and silane gases with a mass flow ratio of the nitrogen monoxide to silane gases being 75:1-85:1;
    depositing a silicon oxynitride layer on the plurality of silicon oxide layers by using nitrogen monoxide and silane gases with a mass flow ratio of the nitrogen monoxide to silane gases being larger than 60:1; and
    annealing the silicon oxynitride layer at an annealing temperature not higher than 250° C.,
    wherein the silicon oxide layers and the silicon oxynitride layer constitute a passivation layer of the array substrate.

2. The method of manufacturing an array substrate according to claim 1, wherein a hydrogen content in the first silicon oxide layer is higher than that in other silicon oxide layers.

3. The method of manufacturing an array substrate according to claim 2, wherein a thickness of the first silicon oxide layer ranges from 200 Å to 800 Å.

4. The method of manufacturing an array substrate according to claim 2, wherein a thickness of the second silicon oxide layer ranges from 500 Å to 1000 Å.

5. The method of manufacturing an array substrate according to claim 1,
    wherein, when the first silicon oxide layer is deposited, a mass flow ratio of the nitrogen monoxide to silane gases is 35:1-45:1.

6. The method of manufacturing an array substrate according to claim 5, wherein the step of depositing a plurality of silicon oxide layers on an active layer further includes:
    depositing a third silicon oxide layer using nitrogen monoxide and silane gases, between the steps of depositing the first silicon oxide layer and the second silicon oxide layer,
    wherein, when the third silicon oxide layer is deposited, a mass flow ratio of the nitrogen monoxide to silane gases is 45:1-75:1.

7. The method of manufacturing an array substrate according to claim 5, wherein the silane gases are monosilane.

8. The method of manufacturing an array substrate according to claim 1, wherein a temperature for depositing the silicon oxynitride layer is 200° C.-350° C.

9. The method of manufacturing an array substrate according to claim 1, wherein an oxygen content in the first silicon oxide layer is lower than that in other silicon oxide layers.

10. A transistor, including:
    an active layer;
    a plurality of silicon oxide layers on the active layer; and
    a silicon oxynitride layer on the plurality of silicon oxide layers,
    wherein the silicon oxide layers and the silicon oxynitride layer constitute a passivation layer of the array substrate,
    the plurality of silicon oxide layers comprises:
        a first silicon oxide layer on the active layer; and
        a second silicon oxide layer above the first silicon oxide layer,
    wherein the second silicon oxide layer is deposited by using nitrogen monoxide and silane gases with a mass flow ratio of the nitrogen monoxide to silane gases being 75:1-85:1,
    the silicon oxynitride layer is deposited by using nitrogen monoxide and silane bases with a mass flow ratio of the nitrogen monoxide to silane gases being larger than 60:1, and
    the silicon oxynitride layer is annealed at an annealing temperature not higher than 250'C.

11. The transistor according to claim 10, wherein a hydrogen content in the first silicon oxide layer is higher than that in other silicon oxide layers.

12. The transistor according to claim 10, wherein an oxygen content in the first silicon oxide layer is lower than that in other silicon oxide layers.

13. The transistor according to claim 10, wherein a thickness of the first silicon oxide layer ranges from 200 Å to 800 Å.

14. The transistor according to claim 13, wherein a thickness of the second silicon oxide layer ranges from 500 Å to 1000 Å.

15. An array substrate, including a transistor array, wherein at least a portion of transistors in the transistor array include:
    an active layer;
    a plurality of silicon oxide layers on the active layer; and
    a silicon oxynitride layer on the plurality of silicon oxide layers,
    wherein the silicon oxide layers and the silicon oxynitride layer constitute a passivation layer of the array substrate,
    the plurality of silicon oxide layers comprises:
        a first silicon oxide layer on the active layer; and
        a second silicon oxide layer above the first silicon oxide layer,
    wherein the second silicon oxide layer is deposited by using nitrogen monoxide and silane gases with a mass flow ratio of the nitrogen monoxide to silane gases being 75:1-85:1,
    the silicon oxynitride layer is deposited by using nitrogen monoxide and silane gases with a mass flow ratio of the nitrogen monoxide to silane gases being larger than 60:1, and
    the silicon oxynitride layer is annealed at an annealing temperature not higher than 250° C.

16. The array substrate according to claim 15, wherein a hydrogen content in the first silicon oxide layer is higher than that in other silicon oxide layers.

17. The array substrate according to claim 15, wherein an oxygen content in the first silicon oxide layer is lower than that in other silicon oxide layers.

18. The array substrate according to claim 15, wherein a thickness of the first silicon oxide layer ranges from 200 Å to 800 Å.

19. A display device, comprising the array substrate according to claim 15.

* * * * *

UNITED STATES PATENT AND TRADEMARK OFFICE
CERTIFICATE OF CORRECTION

PATENT NO. : 11,024,657 B2  
APPLICATION NO. : 16/318740  
DATED : June 1, 2021  
INVENTOR(S) : Zhengliang Li et al.

Page 1 of 1

It is certified that error appears in the above-identified patent and that said Letters Patent is hereby corrected as shown below:

In the Claims

Column 10, Line 26, Claim 10, delete "bases" and insert -- gases --

Column 10, Line 30, Claim 10, delete "250'C." and insert -- 250° C. --

Signed and Sealed this  
Seventeenth Day of August, 2021

Drew Hirshfeld  
*Performing the Functions and Duties of the*  
*Under Secretary of Commerce for Intellectual Property and*  
*Director of the United States Patent and Trademark Office*